(12) United States Patent  (10) Patent No.: US 7,914,126 B2
Kida et al.  (45) Date of Patent: Mar. 29, 2011

(54) INK JET HEAD MANUFACTURING DEVICE, INK JET HEAD MANUFACTURING METHOD, AND INK JET DEVICE

(75) Inventors: Hitoshi Kida, Ibaraki (JP); Takahiro Yamada, Ibaraki (JP); Tomohiko Koda, Ibaraki (JP)

(73) Assignee: Ricoh Printing Systems, Ltd., Tokyo (JP)

( * ) Notice: Subject to any disclaimer, the term of this patent is extended or adjusted under 35 U.S.C. 154(b) by 200 days.

(21) Appl. No.: 12/412,489

(22) Filed: Mar. 27, 2009

(65) Prior Publication Data

US 2009/0244202 A1 Oct. 1, 2009

(30) Foreign Application Priority Data

Mar. 28, 2008 (JP) ................................ 2008-085390
Mar. 16, 2009 (JP) ................................ 2009-063584

(51) Int. Cl.
*B41J 2/045* (2006.01)
(52) U.S. Cl. ........................................................ 347/68
(58) Field of Classification Search .................... 347/68, 347/69, 70–72, 50, 57, 58, 124.14, 124.16, 347/311, 324, 327, 365
See application file for complete search history.

(56) References Cited

U.S. PATENT DOCUMENTS

| 6,732,414 | B2 | 5/2004 | Kitahara |
| 7,222,942 | B2 | 5/2007 | Kawamura |
| 2006/0268072 | A1 | 11/2006 | Yamada et al. |
| 2007/0132813 | A1 | 6/2007 | Yamada et al. |
| 2007/0222822 | A1* | 9/2007 | Ito .................................... 347/59 |
| 2008/0088672 | A1* | 4/2008 | Kobayashi ...................... 347/50 |
| 2008/0111859 | A1* | 5/2008 | Kondo ............................ 347/50 |
| 2008/0291232 | A1 | 11/2008 | Yamada et al. |
| 2008/0316280 | A1 | 12/2008 | Yamada et al. |

FOREIGN PATENT DOCUMENTS

| JP | 2001-277525 A | 10/2001 |
| JP | 2003-055045 A | 2/2003 |
| JP | 2006-315326 A | 11/2006 |
| JP | 3879721 A | 11/2006 |
| JP | 2007-160701 A | 6/2007 |
| JP | 2008-200977 A | 9/2008 |
| JP | 2009-000864 A | 1/2009 |

OTHER PUBLICATIONS

"Piezoelectric Ceramic Technical Handbook", p. 52, in Dec. 2007.
"Nikkei Electronics" No. 635, p. 95, issued on May 8, 1995.

* cited by examiner

*Primary Examiner* — K. Feggins
(74) *Attorney, Agent, or Firm* — Ladas & Parry LLP

(57) ABSTRACT

In an ink jet head manufacturing device, first and second diodes are arranged on a path extending from a gate of a control unit to an individual electrode of an ink-pressure control part in an ink jet head, the first diode allowing a current from the individual electrode of the ink-pressure control part to flow into a first wiring, and the second diode allowing a current from a second wiring to flow into the individual electrode of the ink-pressure control part. A short-circuit unit is arranged to short-circuit the first wiring and the second wiring when depolarization or polarization of the ink-pressure control part is performed.

15 Claims, 14 Drawing Sheets

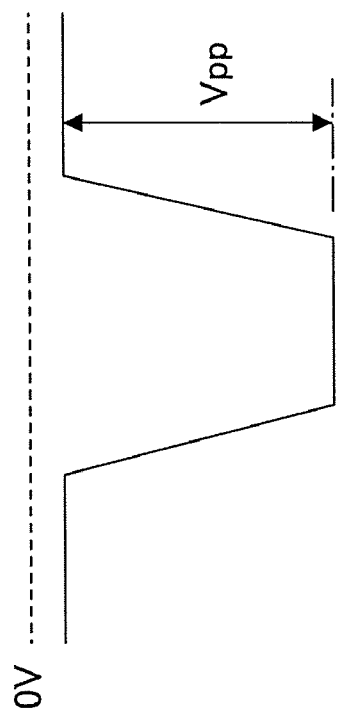
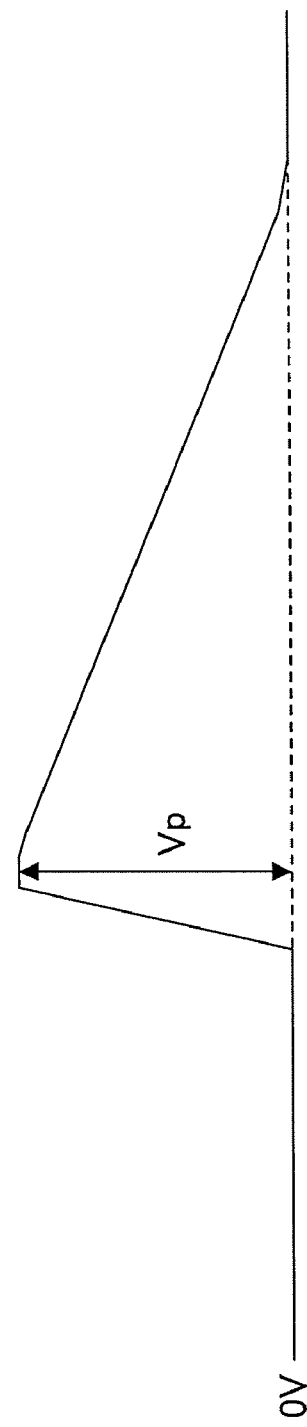
FIG.11A
FIG.11B

INK JET HEAD MANUFACTURING DEVICE, INK JET HEAD MANUFACTURING METHOD, AND INK JET DEVICE

BACKGROUND OF THE INVENTION

1. Field of the Invention

This invention relates to an ink jet head manufacturing device, an ink jet head manufacturing method, and an ink jet device, which are appropriate for performing depolarization or polarization processing of a piezoelectric element as an ink-pressure control part in an ink jet head.

2. Description of the Related Art

A piezoelectric element is known as an ink-pressure control part for use in an ink jet head, and supplying a voltage to the piezoelectric element causes a distortion to be produced in the ink jet head. After baking of a piezoelectric element is performed, polarization processing of the piezoelectric element is performed by supplying a high voltage, which is higher than a normal driving voltage, to the electrodes of the piezoelectric element. By this process, the piezoelectric element shows good piezoelectric characteristics to a specific direction, and it can be used as an actuator in the ink jet head.

Conventionally, after polarization of the piezoelectric element is done, an ink jet head is assembled with the piezoelectric element. However, in order to connect a film substrate on which a control IC is mounted, with the piezoelectric element, soldering, an anisotropy electric conduction film, etc. is used, and heating of the piezoelectric element must be performed at the time of connection of the film substrate and the piezoelectric element. If a temperature of the piezoelectric element during the heating process reaches the Curie temperature, the piezoelectric characteristics of the piezoelectric element will be deteriorated.

To avoid the problem, there is a proposed method of connecting the film substrate on which the control IC is mounted to the piezoelectric element (see Japanese Laid-Open Patent Application No. 2003-55045). In the proposed method, a piezoelectric element having a comparatively high Curie temperature is selected and the connection of the film substrate and the piezoelectric element is performed at a temperature lower than the Curie temperature of the selected piezoelectric element.

However, in recent years, there is the demand for using a solder containing no lead, and, if such a solder is used, a temperature needed for the connection of the film substrate and the piezoelectric element is raised to a higher temperature. Moreover, there is also the demand for using a high temperature at which the heat treatment is conducted, in order to improve the bonding strength and ensure the surface treatment of the nozzle surface or the liquid passage. Selection of a piezoelectric element having a high Curie temperature which is above a desired temperature will result in a problem that the range of selection of a piezoelectric element must be narrowed (see "Nikkei Electronics", No. 635, page 95, issued on May 8, 1995 from Nikkei BP Publication, and "Material Characteristics of Piezoelectric Ceramics", Material-Characteristics Table, in December, 2007 from URL: http://www-.fujicera.co.jp/product/j/01/mat.table_j.pdf>).

When a piezoelectric element is cut into a comb-tooth pattern, or when an ink jet head is assembled, there is a problem that the nozzles of the head have variations in the driving force, due to the factors, including the electric factor, the finishing accuracy, and the assembly accuracy. To avoid the problem, there is a proposed method in which performing depolarization processing of a piezoelectric element is initially performed and re-polarization processing is performed with a suitable intensity individually selected for each of the respective nozzles of the head (which method will be called polarization compensation). See Japanese Laid-Open Patent Application No. 2001-277525 and Japanese Laid-Open Patent Application No. 2006-315326.

A method of performing depolarization of a piezoelectric element is to place the piezoelectric element to a temperature above the Curie temperature (see Japanese Laid-Open Patent Application No. 2001-277525 and "Piezoelectric Ceramic Technical Handbook", page 52, in December, 2007 from URL: http://www.fujicera.co.jp/product/j/01/10.pdf).

In the case of this method, after the ink jet head is assembled, the piezoelectric element must be exposed to a high temperature of several hundreds of degrees C., which will cause the deterioration of the bonding strength of the adhesives and the degradation of the components, etc.

Another method of performing depolarization of a piezoelectric element is to supply an alternating voltage to the electrodes of the piezoelectric element. The resistance of the control unit to the reversed polarity is generally low, and if the above method is used, a problem of destroying the control unit may arise.

A commonly used method of performing polarization of a piezoelectric element is to supply a voltage, which is higher than a certain voltage, to the electrodes of the piezoelectric element (see Japanese Laid-Open Patent Application No. 2001-277525).

In the case of this method, the supplied voltage is higher than the voltage needed for normal driving, and in order to perform polarization safely, it is necessary to select a control unit having a voltage resistance against a high voltage which is higher than the normal driving voltage. Therefore, the range of selection of the control unit is narrowed and the cost is raised.

To avoid the problem, there is a proposed method (see Japanese Patent No. 3879721). FIG. 10 is a diagram showing the composition of a control circuit which performs the proposed method. In the control circuit shown in FIG. 10, a control unit is arranged to determine whether a driving signal is supplied to an ink-pressure control part, in accordance with input data. A polarization voltage is supplied to both a wiring which is electrically connected to a ground terminal of the control unit and a wiring which is electrically connected to a common electrode of the ink-pressure control part. A piezoelectric element is charged with a current which passes through a diode. The diode is arranged so that a current from the wiring electrically connected to the ground terminal of the control unit can flow into the individual electrode of the ink-pressure control part. In the proposed method, the polarization voltage is not supplied to the control unit, which prevents the destruction of the control unit. The polarization processing of all the piezoelectric elements having the common electrode is performed by the same polarization voltage.

As disclosed in Japanese Patent No. 3879721, there is no problem in supplying a direct current voltage to perform a certain polarization. However, when controlling the degree of polarization precisely, it is necessary to supply a pulse-like voltage waveform. When the voltage change of the polarization voltage is very frequent (for example, when a polarization voltage waveform shown in FIG. 11A is supplied to the common electrode of the piezoelectric element), a voltage waveform shown in FIG. 11B appears in the individual electrode of the piezoelectric element.

This is because the control circuit according to the related art shown in FIG. 10 has no path to which the electric discharge flows, and the drop of the voltage of the individual electrode depends on the natural electric discharge of the piezoelectric element.

When the voltage change of the polarization voltage is very frequent, the peak voltage Vp shown in FIG. 11B is increased and approaches the peak voltage Vpp of the polarization voltage. However, the peak voltage Vp is not larger than the value of the sum of the forward drop voltage of the diode D1 and the voltage Vcc, and the risk of destroying the control unit is not so great.

However, the probability that the control unit be destroyed will be increased, and polarization is performed by the electric field produced according to the potential difference between the common electrode and the individual electrode of the piezoelectric element. The composition according to the related art, shown in FIG. 10, has the following problem.

Depending on the value of the peak voltage Vp in FIG. 11B, the polarization may progress to some extent even after the supplying of the polarization waveform is finished. The polarization must be performed by taking into consideration the natural electric discharge of the piezoelectric element, and it is difficult to perform precise polarization. Moreover, a certain period of time is needed for the natural electric discharge, and the productivity becomes poor.

When it is intended to perform depolarization of a piezoelectric element, it is necessary to supply the alternating voltage to the electrodes of the piezoelectric element, so as to change the direction of the electric field generated between the common electrode and the individual electrode of the piezoelectric element successively.

In the control circuit according to the related art, shown in FIG. 10, there is no path to which the electric discharge flows. When the voltage change of the depolarization voltage is very frequent (for example, when a depolarization voltage waveform shown in FIG. 12A is supplied to the common electrode of the piezoelectric element), a voltage waveform shown in FIG. 12B appears in the individual electrode of the piezoelectric element. The direction of the electric field generated between the common electrode and the individual electrode does not change, and it is impossible to perform depolarization.

In recent years, an ink jet head has come to be used for industrial fields, and it is demanded to reduce as small as possible the variations in the discharge liquid drop weight for every nozzle of the ink jet head, such as in a manufacturing device of a organic EL (electroluminescent) display.

Moreover, the improvement of the printing speed of printers is being rapidly enhanced, and it is demanded to reduce as small as possible the variations in the discharge liquid drop speed for every nozzle of the ink jet head. In order to suppress the variations in the discharge liquid drop, the method of performing the polarization compensation described above is effective. However, even if the products after the polarization compensation are delivered, the problem of the variations in the discharge liquid drop arises due to the changes over time, the environmental changes, etc.

SUMMARY OF THE INVENTION

In one aspect of the invention, the present disclosure provides an ink jet head manufacturing device and an ink jet device which are able to perform appropriately depolarization or polarization of an ink-pressure control part in an ink jet head on which a control unit is mounted.

In one aspect of the invention, the present disclosure provides an ink jet head manufacturing method which is able to perform appropriately driving, depolarization, or polarization of the ink-pressure control part in the ink jet head.

In an embodiment of the invention which solves or reduces one or more of the above-mentioned problems, the present disclosure provides an ink jet head manufacturing device for manufacturing an ink jet head having a substrate on which an ink pressure chamber, an ink-pressure control part to increase or decrease a pressure of ink within the ink pressure chamber, and a control unit to control a driving signal supplied to the ink-pressure control part are mounted, wherein the ink jet head manufacturing device is arranged so that a first wiring connected to a high voltage power supply terminal of the control unit, a second wiring connected to a ground terminal of the control unit, and a third wiring connected to a common electrode of the ink-pressure control part are not mutually short-circuited on the substrate of the ink jet head, the ink jet head manufacturing device comprising: first and second diodes arranged on a path extending from a gate of the control unit to an individual electrode of the ink-pressure control part, the first diode allowing a current from the individual electrode of the ink-pressure control part to flow into the first wiring, and the second diode allowing a current from the second wiring to flow into the individual electrode of the ink-pressure control part; and a short-circuit unit arranged to short-circuit the first wiring and the second wiring when depolarization or polarization of the ink-pressure control part is performed.

In an embodiment of the invention which solves or reduces one or more of the above-mentioned problems, the present disclosure provides an ink jet device including an ink jet head and a head connecting substrate, the ink jet head including a substrate on which an ink pressure chamber, an ink-pressure control part to increase or decrease a pressure of ink within the ink pressure chamber, and a control unit to control a driving signal supplied to the ink-pressure control part are mounted, and the head connecting substrate being arranged to perform one of driving, polarization and depolarization of the ink-pressure control part in the ink jet head, the ink jet head is arranged so that a first wiring connected to a high voltage power supply terminal of the control unit, a second wiring connected to a ground terminal of the control unit, and a third wiring connected to a common electrode of the ink-pressure control part are not mutually short-circuited on the substrate of the ink jet head, the ink jet head comprising first and second diodes arranged on a path extending from a gate of the control unit to an individual electrode of the ink-pressure control part, the first diode allowing a current from the individual electrode of the ink-pressure control part to flow into the first wiring, and the second diode allowing a current from the second wiring to flow into the individual electrode of the ink-pressure control part, and the head connecting substrate comprising a short-circuit unit arranged to short-circuit the first wiring and the second wiring when depolarization or polarization of the ink-pressure control part is performed.

In an embodiment of the invention which solves or reduces one or more of the above-mentioned problems, the present disclosure provides an ink jet head manufacturing method for manufacturing an ink jet head having a substrate on which an ink pressure chamber, an ink-pressure control part to increase or decrease a pressure of ink within the ink pressure chamber, and a control unit to control a driving signal supplied to the ink-pressure control part are mounted, wherein the ink jet head is arranged so that a first wiring connected to a high voltage power supply terminal of the control unit, a second wiring connected to a ground terminal of the control unit, and a third wiring connected to a common electrode of the ink-pressure control part are not mutually short-circuited on the substrate of the ink jet head, the ink jet head comprising first and second diodes arranged on a path extending from a gate of the control unit to an individual electrode of the ink-pressure control part, the first diode allowing a current from the individual electrode of the ink-pressure control part to flow into the first wiring, and the second diode allowing a current from the second wiring to flow into the individual electrode of the ink-pressure control part, the ink jet head manufacturing method comprising a step of short-circuiting the first wiring and the second wiring when depolarization or polarization of the ink-pressure control part is performed.

Other objects, features and advantages of the present invention will become more apparent from the following detailed description when read in conjunction with the accompanying drawings.

BRIEF DESCRIPTION OF THE DRAWINGS

FIG. 11A and FIG. 11B are diagrams for explaining the problem of the control circuit according to the related art.

DETAILED DESCRIPTION OF THE PREFERRED EMBODIMENTS

A description will be given of embodiments of the invention with reference to the accompanying drawings.

Figure 1:
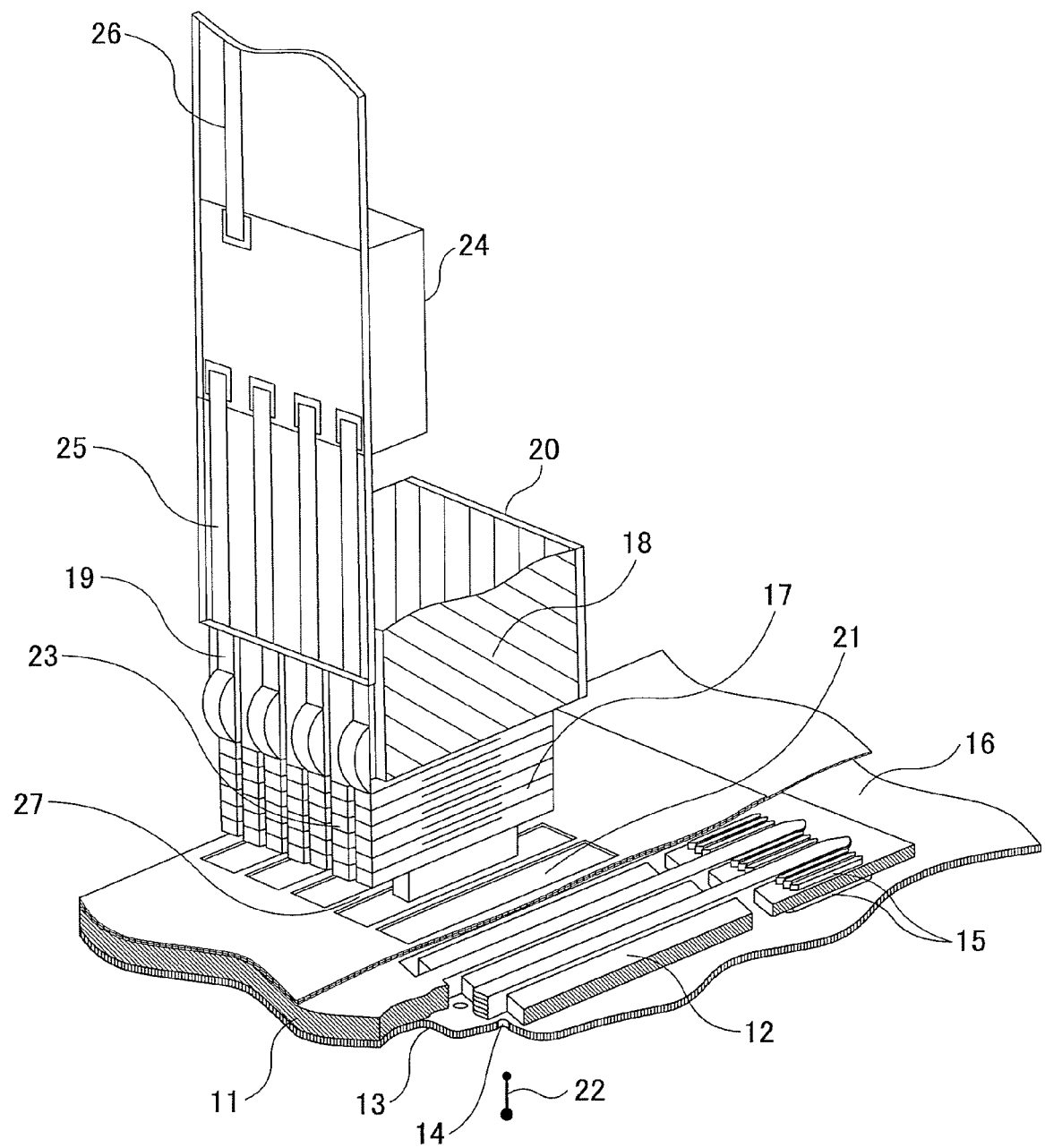
FIG. 1 is a perspective view of an ink jet head to which an embodiment of the invention is applied.

FIG. 1 is a perspective view of an ink jet head to which an embodiment of the invention is applied. As shown in FIG. 1, an ink pressure chamber 12 is formed in an ink passages forming member 11, and one end of the ink pressure chamber 12 is open to communicate with a nozzle 14 which is opened in a nozzle plate 13.

The other end of the ink pressure chamber 12 is open to communicate to a common ink passage 16 through a restrictor 15 which is the part where the ink passage is extracted, and the restrictor 15 is arranged in order to prevent the pressure supplied to ink from escaping.

An ink-pressure control unit to generate a pressure for discharging an ink drop includes a piezoelectric element 17 of a lamination structure. The piezoelectric element 17 is fixed to a piezoelectric element supporting base 18 provided in the lamination direction, and the piezoelectric element 17 generates a pressure using the piezoelectric elasticity in the d33 direction. Therefore, if the voltage supplied to the individual electrode 19 provided in the plus terminal of the piezoelectric element 17 falls and the piezoelectric element 17 is discharged, the pressure of ink in the ink pressure chamber 12 is reduced. If the voltage supplied to the individual electrode 19 of the piezoelectric element 17 rises and the piezoelectric element 17 is charged, the pressure of ink in the ink pressure chamber 12 is increased.

The individual electrode 19 of the piezoelectric element 17 is arranged on one side of the piezoelectric element supporting base 18. A wiring 25 is connected to the output terminal of the control unit 24 by ultrasonic welding, and this wiring 25 is connected to the individual electrode 19 of the piezoelectric element 17 by soldering. A wiring 26 is connected to the drive voltage input terminal of the control unit 24 by ultrasonic welding, and this wiring 26 is connected to the output of a drive voltage generator circuit (not shown).

The common electrode 20 provided in the negative electrode of the piezoelectric element 17 is an electrode common to the negative electrode of each piezoelectric element 17. The common electrode 20 is arranged on the other surface of the piezoelectric element supporting base 18, and this common electrode 20 is connected to the ground of a drive voltage generator circuit (not shown). The piezoelectric element supporting base 18 and the ink passages forming member 11 are fixed to the housing (not shown), and relative movement of the element supporting base 18 and the ink passages forming member 11 is impossible.

The surface of the piezoelectric element 17 which is not fixed to the piezoelectric element supporting base 18 is fixed to an elastic film 21. The elastic film 21 forms a part of the walls of the ink pressure chamber 12. If the elastic plate 21 deforms by the elasticity of the piezoelectric element 17, the volume of the ink pressure chamber 12 changes.

A piezoelectric element 23 which is not connected to the wiring 26 is formed adjacent to the piezoelectric element 17 connected to the wiring 26. The surface of the piezoelectric element 23 which is not fixed to the piezoelectric element supporting base 18 is fixed to a partition 27 of the ink pressure chamber 12. This structure is useful to increase the rigidity of the ink jet head.

In the ink jet head to which an embodiment of the invention is applied, a plurality of the components each having the above-described structure are arrayed in one row at intervals of 1/150 inch.

Next, the principle of discharging an ink drop in the ink jet head will be described.

A control unit 24 is connected to the individual electrode 19 of the piezoelectric element 17. In accordance with the data received from a processor unit (not shown), the control unit 24 connects the wiring 26 to which the drive voltage is supplied to only the individual electrode 19 of the piezoelectric element of the nozzle which is active for discharging an ink drop, so that charging and discharging of the piezoelectric element 17 are performed by the drive voltage supplied to the individual electrode 19.

A DC voltage is supplied to the individual electrode 19 of the piezoelectric element 17 of the nozzle which is not active for discharging an ink drop, so as to avoid natural discharging. The piezoelectric element 17 is charged and extended in the lamination direction from the natural length, so that the elastic film 21 is substantially in the state in which it is pushed into the ink pressure chamber 12. If the voltage supplied to the individual electrode 19 falls, discharging is performed and the elastic film 21 is shrunk in the lamination direction. The elastic film 21 is pulled by this action and the pressure of the ink pressure chamber 12 is reduced, so that ink is supplied to the ink pressure chamber 12 through the restrictor 15 from the common ink passage 16.

If the voltage supplied to the positive individual electrode 19 rises, the piezoelectric element is charged and extended in the lamination direction, so that the elastic film 21 is pressed back to the ink pressure chamber 12. The ink in the ink pressure chamber 12 is pressurized by this action, and the ink is discharged from the nozzle 14 which is open to communicate with the ink pressure chamber 12, as an ink drop 22.

Because it is designed so that the surface tension acting on the nozzle 14 is larger than the flow path resistance of the restrictor 15 when the ink pressure chamber 12 is in the pressure reduction process, air is not drawn from the nozzle 14 and ink is supplied to the ink pressure chamber 12. Because it is designed so that the flow path resistance of the restrictor 15 is larger than the surface tension acting on the nozzle 14 in the pressurizing process of the ink pressure chamber 12, ink from the restrictor 15 is not returned to the common ink passage 16 and an ink drop is discharged from the nozzle 14.

Figure 3:
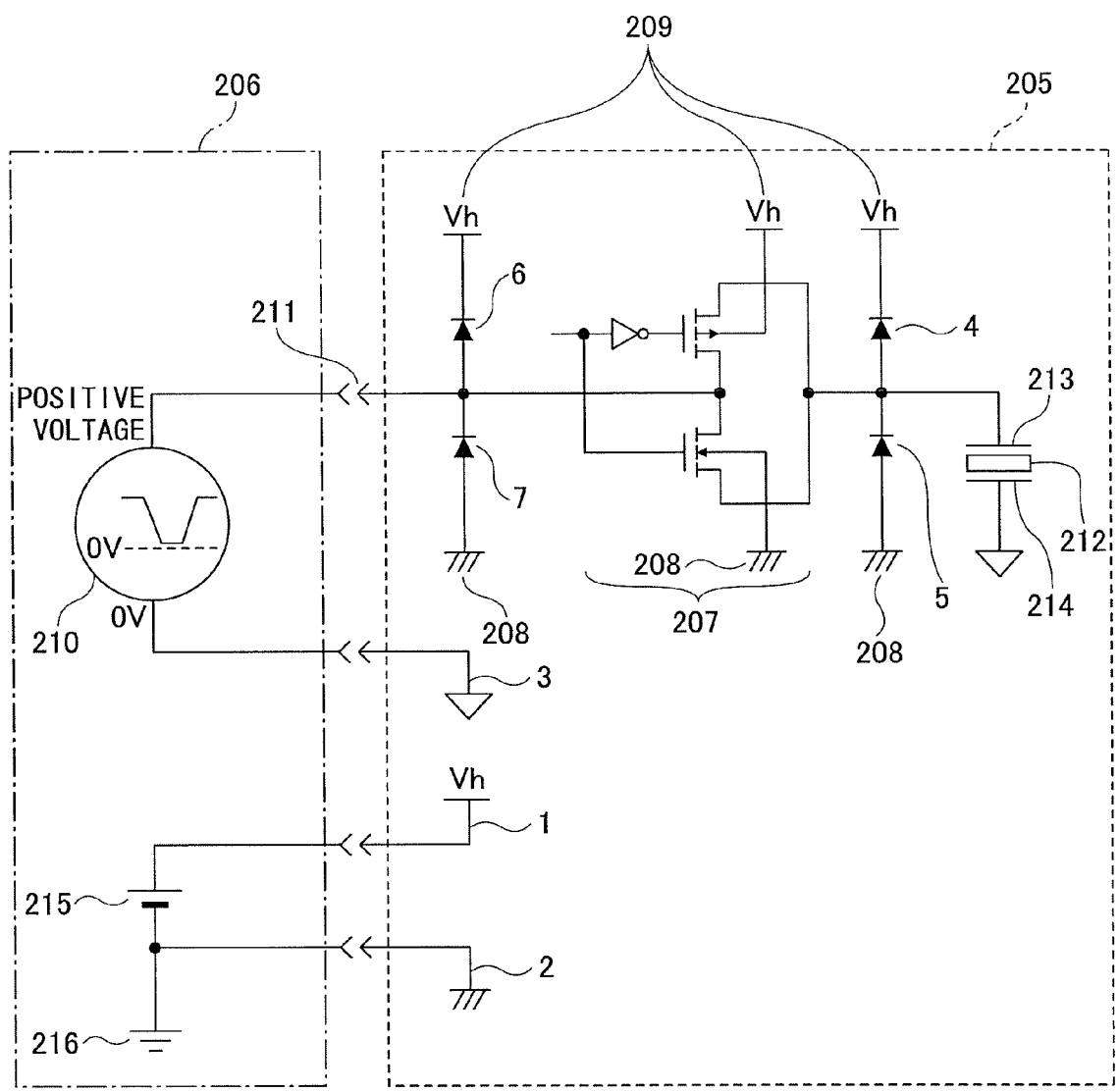
FIG. 3 is a circuit diagram showing the condition of an ink jet device of another embodiment of the invention at a time of driving of the ink jet head.

FIG. 3 is a circuit diagram showing the condition of an ink jet device of an embodiment of the invention at a time of driving of the ink jet head. In FIG. 3, the block 205 surrounded by the dotted line denotes an ink jet head, and the block 206 surrounded by the one-dot chain line denotes a head connecting substrate. The ink jet head 205 includes diodes 4 to 7 which are parasitic diodes that are produced even if the production is not intended in the manufacturing process.

The diodes 4 to 7 function as a protection circuit that prevents the damaging of the gate 207, as follows. If a voltage lower than voltage Vd which is a difference between the voltage supplied to the ground terminal 208 of the control unit and the forward drop voltage of the diode 5 or 7 is supplied to the gate 207 of the control unit, the current flows from the ground terminal 208 of the control unit through the diode 5 or 7, so as to prevent the supplied voltage from being below the voltage Vd. If a voltage higher than voltage Vu which is a sum of the forward drop voltage of the diode 4 or 6 and the voltage supplied to the high voltage power supply terminal 209 of the control unit is supplied to the gate 207 of the control unit, the current flows into the high voltage power supply terminal 209 of the control unit through the diode 4 or 6, so as to prevent the supplied voltage from being above the voltage Vu. Therefore, the diodes 4 to 7 constitute a protection circuit that prevents the damaging of the gate 207.

The drive voltage 210 is supplied from the drive voltage input terminal 211 to the gate 207 of the control unit. When the gate 207 is turned on, the drive voltage 210 is supplied through the gate 207 to the individual electrode 213 of the piezoelectric element 212 which is connected to the gate 207, so that charging and discharging of the piezoelectric element 212 is performed.

When the gate 207 is turned off, no voltage is supplied to the individual electrode 213 of the piezoelectric element 212. In this embodiment, a gate of the type called a transmission gate is used as the gate 207 of the control unit. However, the invention is not limited to this embodiment and it is applicable to a gate of any type.

The high voltage power supply 215 is supplied to the high voltage power supply terminal 209 of the control unit, and this voltage is set up to be larger than the drive voltage 210. The ground terminal 208 of the control unit is short-circuited to the ground 216.

In the ink jet device of FIG. 3, a wiring 1 electrically connected to the high voltage power supply terminal 209 of the control unit, a wiring 2 electrically connected to the ground terminal 208 of the control unit, and a wiring 3 electrically connected to the common electrode 214 of the piezoelectric element 212 are not mutually short-circuited. The invention is applicable in any case where the wirings are connected to a capacitor, a resistor, etc. or the wirings are insulated.

Figure 4:
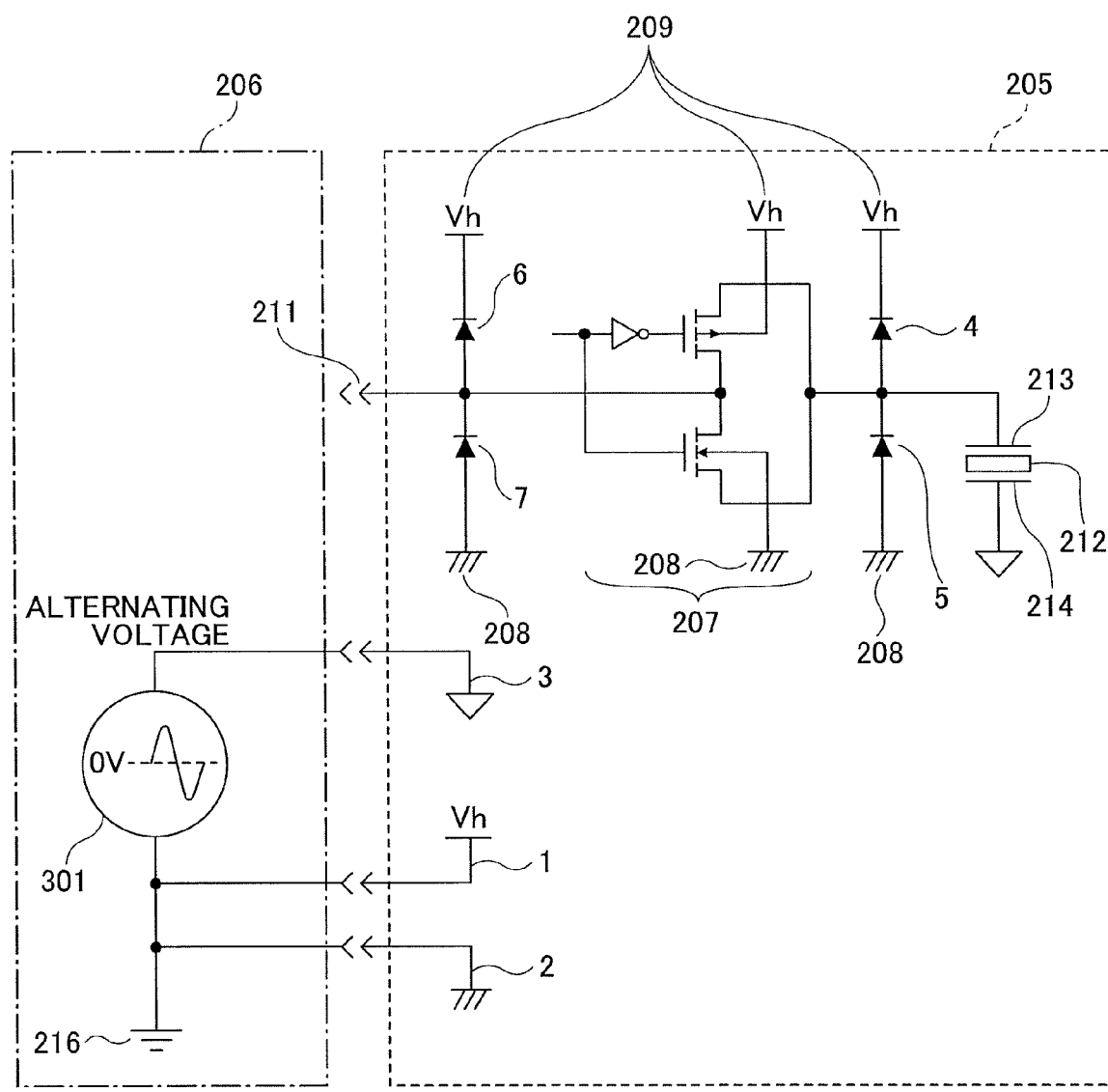
FIG. 4 is a circuit diagram showing the condition of the ink jet device of this embodiment at a time of performing depolarization of the piezoelectric element in the ink jet head.

FIG. 4 is a circuit diagram showing the condition of the ink jet device of this embodiment at a time of performing depolarization of the piezoelectric element in the ink jet head.

In this condition, the gate 207 of the control unit is set in the OFF state. Supply of the power supply 215 to the high voltage power supply terminal 209 is not performed.

The wiring 1 electrically connected to the high voltage power supply terminal 209 of the control unit and the wiring 2 electrically connected to the ground terminal 208 of the control unit are short-circuited, and the wirings 1 and 2 are connected to the ground 216.

A depolarization voltage 301 is supplied to between the wirings 1 and 2 and the wiring 3 electrically connected to the common electrode 214 of the piezoelectric element 212. This depolarization voltage is the alternating current and cancels polarization of the piezoelectric element 212 by changing the direction of the electric field between the individual electrode 213 and the common electrode 214 of the piezoelectric element 212 alternately.

When the voltage supplied to the common electrode 214 of the piezoelectric element 212 is rising, the current from the individual electrode 213 of the piezoelectric element 212 flows into the high voltage power supply terminal 209 via the diode 4, to discharge the piezoelectric element 212. Because the voltage supplied to the individual electrode 213 and the output of the gate 207 of the control unit is maintained at the forward drop voltage of the diode 4, the potential difference between the individual electrode 213 and the common electrode 214 of the piezoelectric element 212 can be made nearly equal to the depolarization voltage 301.

When the voltage supplied to the common electrode 214 of the piezoelectric element 212 is falling, the current from the ground electrode 208 of the control unit flows into the individual electrode 213 of the piezoelectric element 212 via the diode 5, to charge the piezoelectric element 212. Because the voltage supplied to the individual electrode 213 and the output of the gate 207 of the control unit is maintained at the value minus the forward drop voltage of the diode 5, the potential difference between the individual electrode 213 and the common electrode 214 of the piezoelectric element 212 can be made nearly equal to the depolarization voltage 301.

As explained above, only a reverse bias voltage like the forward drop voltage of the diode is supplied to the control unit and the diodes 4 and 5, and destruction of the control unit does not take place. The depolarization voltage exceeding the withstanding voltage of the control unit can be supplied to between the electrodes of the piezoelectric element, and depolarization of the piezoelectric element can be performed.

In the above-mentioned composition of FIG. 4, the drive voltage input terminal 211 is open. Alternatively, the drive voltage input terminal 211 may be short-circuited to the ground 216.

In the above-mentioned composition of FIG. 4, the wiring 1 and the wiring 2 are short-circuited to the ground 216. However, even if the wiring 1 and the wiring 2 are not short-circuited to the ground 216, if the wiring 1 and the wiring 2 are short-circuited simply the potential difference which exceeds the withstanding voltage of the control unit will not be produced, and the same effect is acquired.

However, in that case, a potential difference between the ground terminal 208 and the ground 216 may arise. It is preferred that the drive voltage input terminal 211 is not short-circuited to the ground 216, in that case, thereby preventing the current from flowing into the circuit through the drive voltage input terminal 211.

Figure 5:
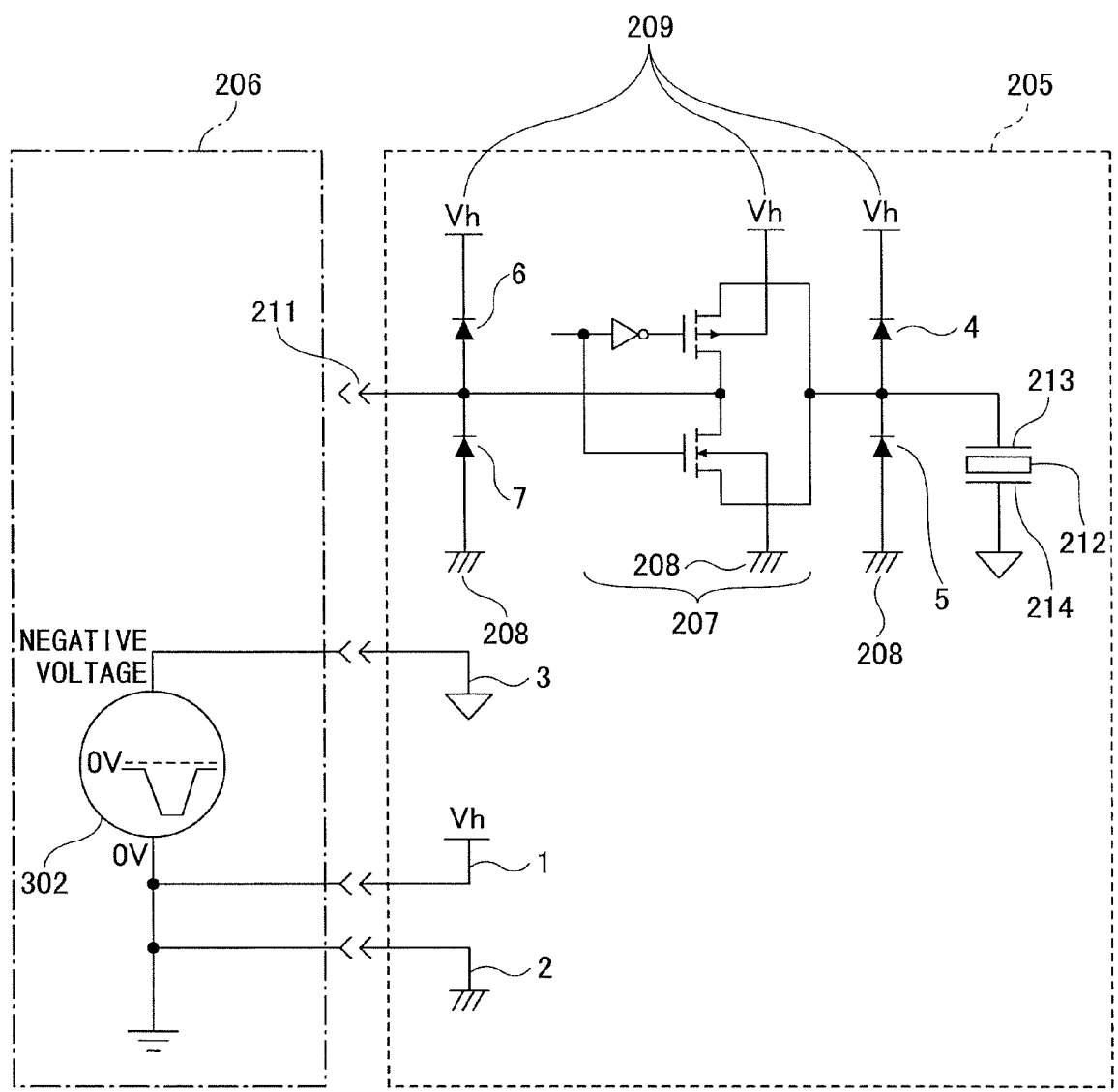
FIG. 5 is a circuit diagram showing the condition of the ink jet device of this embodiment at a time of performing polarization of the piezoelectric element in the ink jet head.

FIG. 5 is a circuit diagram showing the condition of the ink jet device of this embodiment at a time of performing polarization of the piezoelectric element in the ink jet head.

The polarization voltage 302 is supplied to between the wiring 3 electrically connected to the common electrode 214 of the piezoelectric element 212, and the wiring 1 electrically connected to the high voltage power supply terminal 209 of the control unit and the wiring 2 electrically connected to the ground terminal 208 of the control unit, such that the wiring 3 is set to the negative voltage.

The potential of the common electrode 214 is made lower than the potential of the individual electrode 213 of the piezoelectric element 212, an electric field is generated in the direction from the individual electrode 213 to the common electrode 214, so as to arrange the direction of polarization. Other composition of the ink jet device is the same as that at the time of depolarization, and a description thereof will be omitted.

In the above-mentioned composition of FIG. 5, the drive voltage input terminal 211 is open. Alternatively, the drive voltage input terminal 211 may be short-circuited to the ground 216.

In the above-mentioned composition of FIG. 5, the wiring 1 and the wiring 2 are short-circuited to the ground 216. However, even if the wiring 1 and the wiring 2 are not short-circuited to the ground 216, if the wiring 1 and the wiring 2 are short-circuited simply the potential difference which exceeds the withstanding voltage of the control unit will not be produced, and the same effect is acquired.

However, in that case, a potential difference between the ground terminal 208 and the ground 216 may arise. It is preferred that the drive voltage input terminal 211 is not short-circuited to the ground 216, in that case, thereby preventing the current from flowing into the circuit through the drive voltage input terminal 211.

If the ink jet device of the above composition is used, it is possible to perform depolarization of the piezoelectric element by supplying the voltage of the alternating polarity to the electrodes of the piezoelectric element wherein the control unit is mounted on the ink jet head, without destroying the control unit. And it is possible to perform polarization of the piezoelectric element by supplying the voltage higher than the withstanding voltage of the control unit to between the electrodes of the piezoelectric element.

Another embodiment of the invention will be described with reference to FIG. 13 and FIG. 14.

Figure 13:
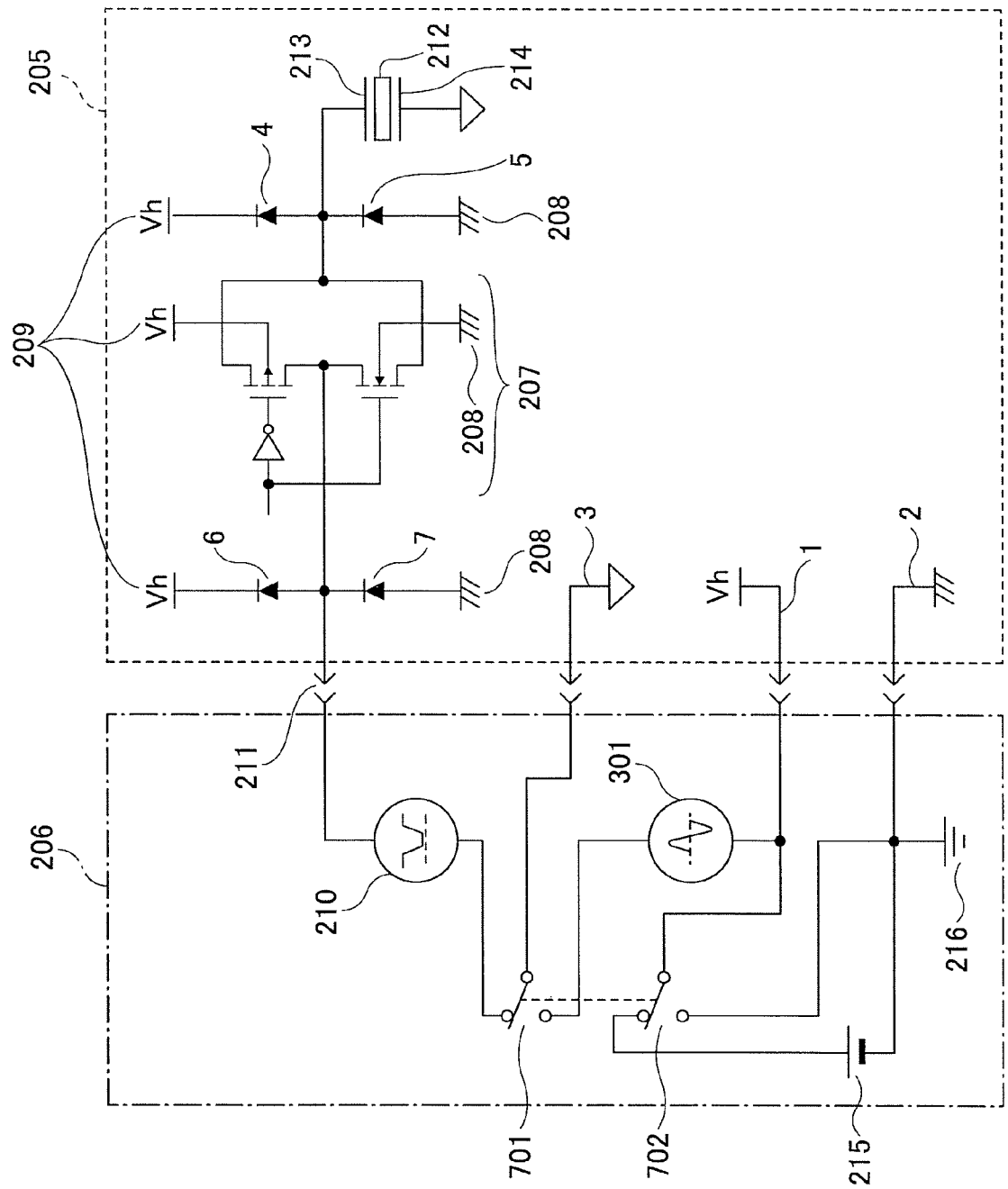
FIG. 13 is a circuit diagram showing the composition of an ink jet device of another embodiment of the invention.

In the embodiment of FIG. 13, switches 701 and 702 are changeover switches which are controllable by an externally supplied signal, such as solid state relays or mechanical relays. The switch 701 is arranged so that one end of the switch 701 is permanently connected to the wiring 3 which is connected to the common electrode of the piezoelectric element, and one of the drive voltage 210 and the depolarization voltage 301 is selected at the other end of the switch 701, so that the selected voltage is supplied to the wiring 3.

In the condition of the switch 701 shown in FIG. 13, the drive voltage 210 is connected to the wiring 3 (which is connected to the common electrode of the piezoelectric element) by the switch 701. On the other hand, in the condition of the switch 701 shown in FIG. 14, the depolarization voltage 301 is connected to the wiring 3 (which is connected to the common electrode of the piezoelectric element) by the switch 701.

The switch 702 is arranged so that one end of the switch 702 is permanently connected to the wiring 1 which is connected to the high voltage power supply terminal 209, and one of the high voltage power supply 215 and the wiring 2 (which is connected to the ground terminal 208) is selected at the other end of the switch 702.

In the condition of the switch 702 shown in FIG. 13, the high voltage power supply 215 is connected to the wiring 1 (which is connected to the high voltage power supply terminal 209) by the switch 702. On the other hand, in the condition of the switch 702 shown in FIG. 14, the wiring 1 (which is connected to the high voltage power supply terminal 209) is connected to the wiring 2 (which is connected to the ground terminal 208) by the switch 702.

Figure 14:
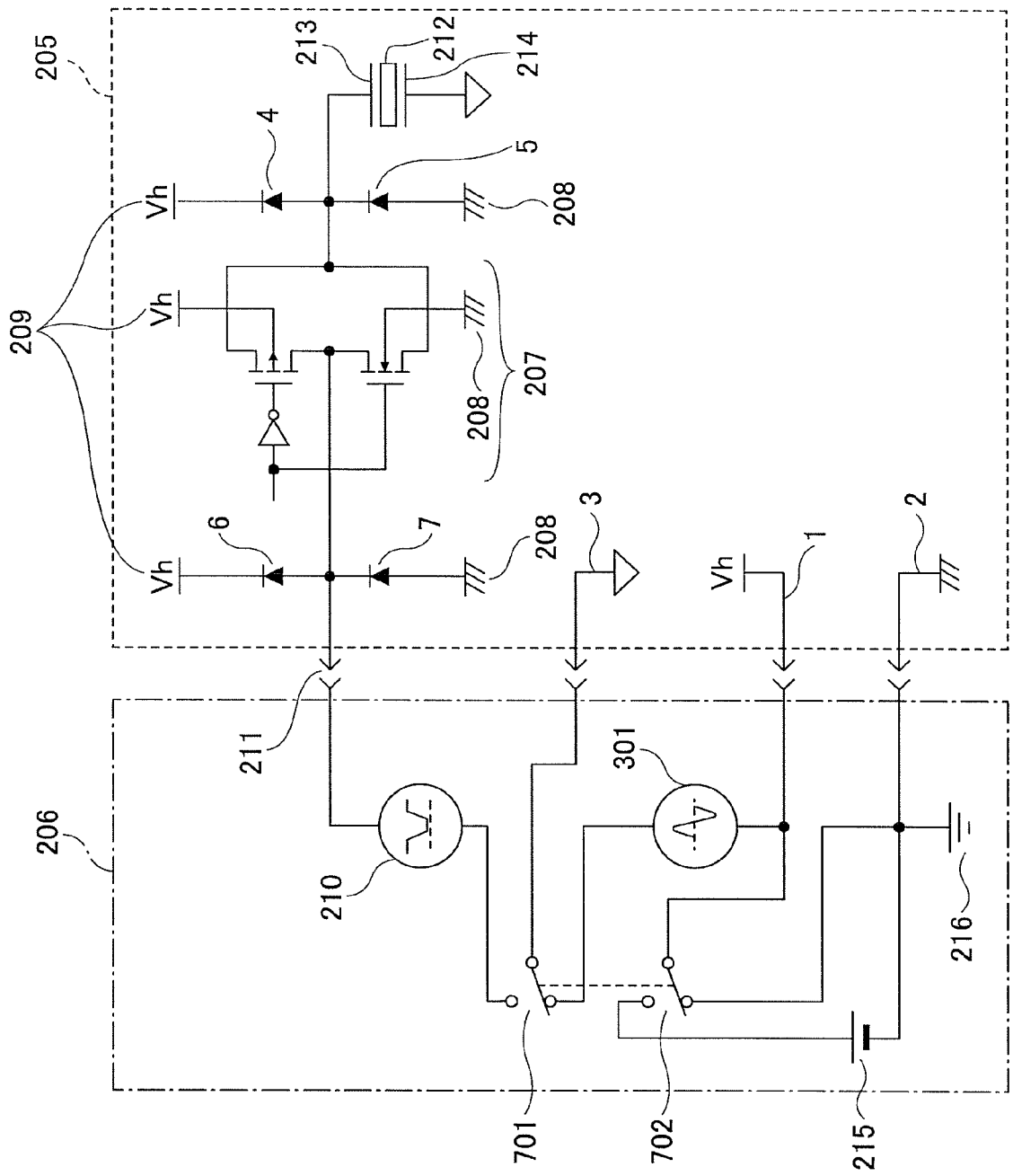
FIG. 14 is a circuit diagram showing the composition of an ink jet device of another embodiment of the invention.

If the switches 701 and 702 are set as shown in FIG. 13, the circuit shown in FIG. 3 is constituted, and if the switches are set as shown in FIG. 14, the circuit shown in FIG. 4 or FIG. 5 is constituted. Normally, the ink jet device is operated in the condition of FIG. 13. When performing polarization (or polarization compensation) of the piezoelectric element, the condition of FIG. 13 is changed to the condition of FIG. 14, and, after depolarization of the piezoelectric element is initially performed, polarization (or polarization compensation) of the piezoelectric element is performed. Then, the condition of FIG. 14 is returned to the condition of FIG. 13 for starting the operation of the ink jet device.

When performing polarization compensation of the piezoelectric element, the condition of FIG. 13 is changed to the condition of FIG. 14, and, after depolarization of the piezoelectric element is initially performed, the condition of FIG. 14 is changed to the condition of FIG. 13. Then, while the nozzle for which the polarization is to be performed is selected by the control unit, polarization of the piezoelectric element of the nozzle is performed with the optimal polarization voltage for the piezoelectric element of the nozzle, so that the driving force of the piezoelectric element is corrected. After polarization compensation is completed for all the nozzles, the operation of the ink jet head is started.

The polarization voltage at this time should be a value below the withstanding voltage of the control unit. The optimal polarization voltage means that a comparatively high polarization voltage is used for a nozzle with a low ink drop speed or a small ink drop weight, or a comparatively low polarization voltage is used for a nozzle with a high ink drop speed or a large ink drop weight.

In this manner, the ink jet device of this embodiment is arranged to perform polarization compensation automatically. The ink jet device of this embodiment may be used to perform polarization compensation periodically, or to perform polarization compensation when a detected variation of the discharge liquid drop is larger than a threshold value. It is possible to provide an ink jet device with very small variations in the discharge liquid drop.

It is preferred that the switches 701 and 702 are interlocked with each other. By interlocking the switches, supplying a single control signal enables selection of one of the operation condition, the re-polarization condition, and the depolarization condition of the ink jet device. Manual switches, such as toggle switches, may be used as the switches 701 and 702, and one condition of depolarization processing, polarization processing, and driving operation may be changed to another condition by manual operation. In this embodiment, if "the operation of the ink jet head" is replaced with as "head discharging inspection", it is possible to provide the ink jet head manufacturing device according to the invention.

Figure 2:
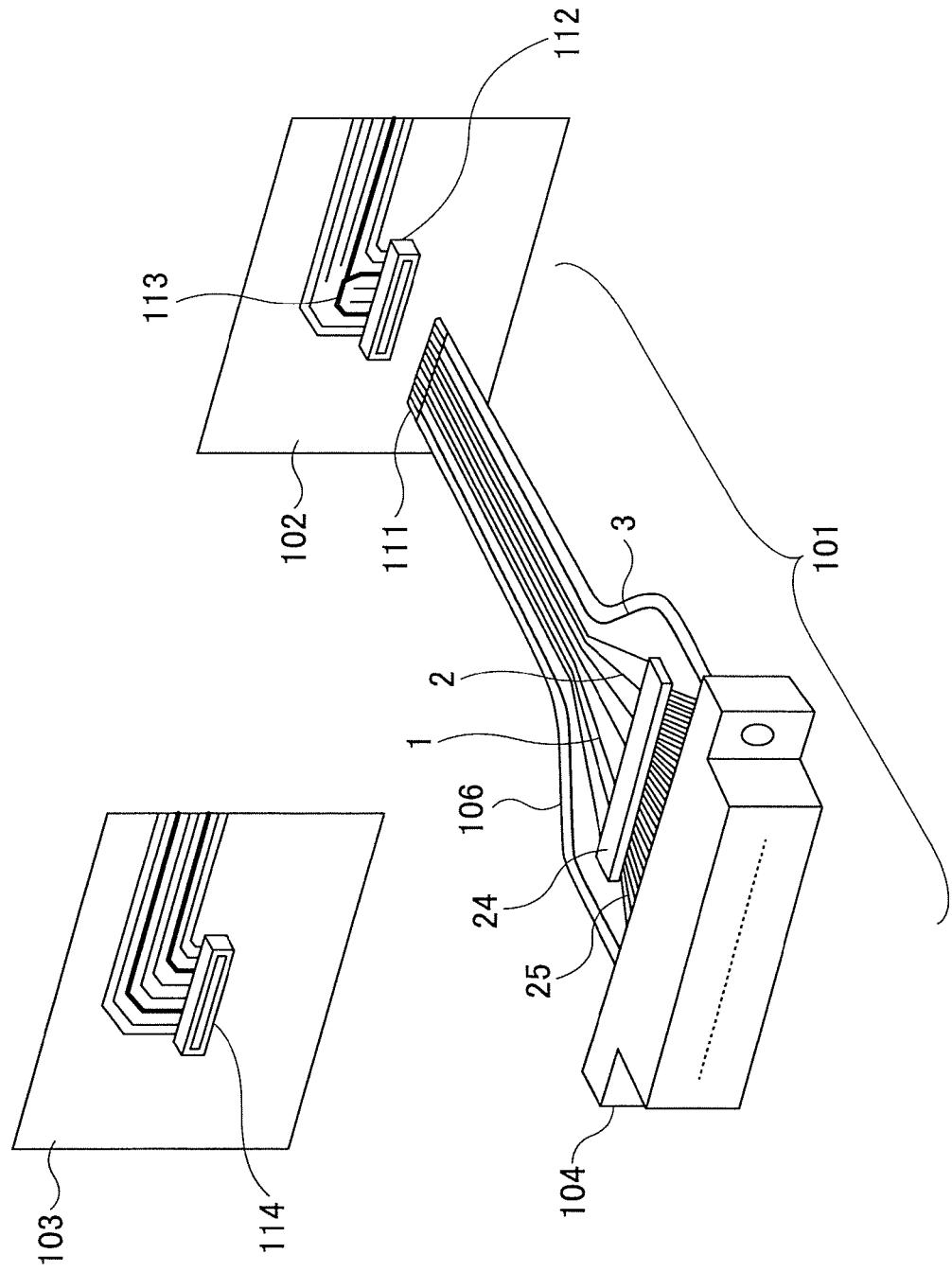
FIG. 2 is a perspective view of an ink jet device including an ink jet head and a head connecting substrate in an embodiment of the invention.

Another embodiment of the invention will be described. FIG. 2 is a perspective view of an ink jet device including an ink jet head and a head connecting substrate in an embodiment of the invention. In FIG. 2, reference numeral 101 denotes an ink jet head, 102 denotes a first head connecting substrate that is used at the time of depolarization or polarization processing, 103 denotes a second head connecting substrate that is used at the time of head driving or polarization processing.

In the ink jet head 101, the piezoelectric element and the ink passage are included in the housing 104. The control unit 24 is mounted on a film substrate 106, and this film substrate 106 is projecting from the housing 104. A wiring 25 is connected to the output terminal of the control unit 24, and this wiring 25 is electrically connected to the individual electrode of the piezoelectric element (not illustrated) which is also included in the housing 104. The common electrode of the piezoelectric element (not illustrated) is electrically connected to the wiring 3.

The first wiring 1 electrically connected to the high voltage power supply terminal of the control unit 24, the second wiring 2 electrically connected to the ground terminal of the control unit 24, and the third wiring 3 electrically connected to the common electrode of the piezoelectric element (not illustrated) are connected to the terminal block 111 at the end of the film substrate 106.

The first head connecting substrate 102 is provided with a connector 112 which is able to be fitted to the terminal block 111 on the side of the ink jet head 101. With the wiring pattern 113 on the first head connecting substrate 102, the terminals of the connector 112 corresponding to the first wiring 1 and the second wiring 2 are short-circuited. When the terminal block 111 and the connector 112 are fitted to each other, the first wiring 1 and the second wiring 2 are short-circuited to each other.

The second head connecting substrate 103 is provided with a connector 114 which is able to be fitted to the terminal block 111 on the side of the ink jet head 101. On the second head connecting substrate 102, the terminals of the connector 114 corresponding to the first wiring 1 and the second wiring 2 are not short-circuited. Even when the terminal block 111 and the connector 114 are fitted to each other, the first wiring 1 and the second wiring 2 are not short-circuited.

When performing polarization of all the piezoelectric elements sharing the common electrode with the same polarization voltage collectively, the first head connecting substrate 102 and the ink jet head 101 are connected, the first wiring 1 and the second wiring 2 are short-circuited to perform depolarization or polarization. After the depolarization or the polarization is completed, the short circuit is canceled by reconnecting the ink jet head 101 to the second head connecting substrate 103, and the ink jet head 101 is driven.

When performing polarization compensation, the ink jet head 101 is connected to the first head connecting substrate 102, the first wiring 1 and the second wiring 2 are short-circuited to perform depolarization. After this, the short circuit is canceled by reconnecting the ink jet head 101 to the second head connecting substrate 103. While the nozzle for which polarization is to be performed is selected by the control unit, polarization of the piezoelectric element of the nozzle is performed with the optimal polarization voltage.

After polarization compensation is completed for all the nozzles, the driving operation of the ink jet head 101 is performed.

A description will now be given of the forward drop voltage of a diode. To cause the current to flow through the diode, it is necessary to raise the potential difference between the anode and the cathode of the diode to the level above a certain voltage. To cause a large amount of current to flow through the diode, it is necessary to further raise the potential difference between the anode and the cathode of the diode. The forward drop voltage of the diode according to the invention is the potential difference between the cathode and the anode of the diode.

Figure 6A:
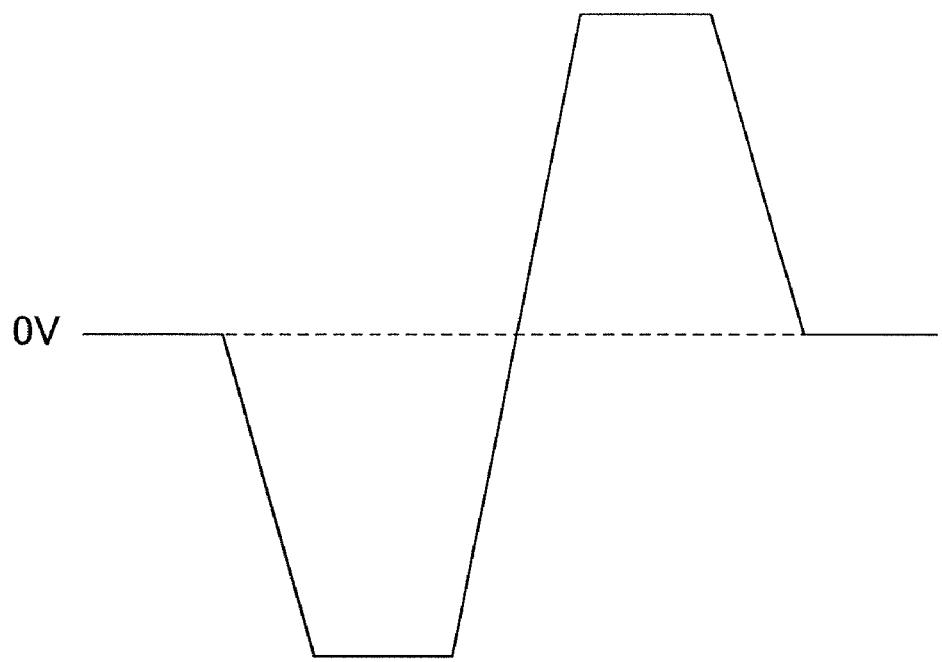
FIG. 6A and FIG. 6B are diagrams for explaining the forward drop voltage of a diode.
Figure 6B:
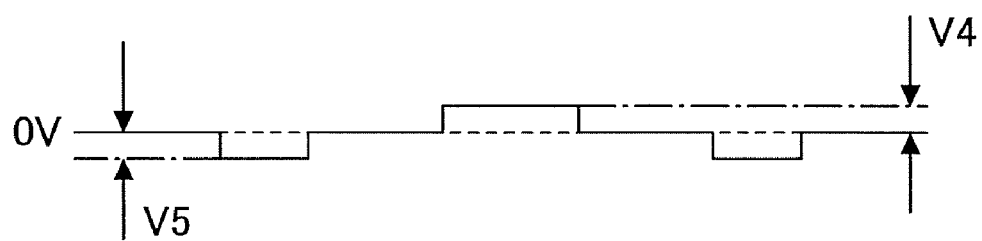

For example, in the circuit of FIG. 4, when the depolarization voltage 301 is in the waveform as shown in FIG. 6A, the voltage supplied to the output of the individual electrode 213 and the gate 207 of the control unit is in the waveform as shown in FIG. 6B.

When the voltage in the waveform of FIG. 6A is falling, the reversed polarity voltage of the forward drop voltage V5 of the diode 5 appears in the waveform of FIG. 6B. When the voltage in the waveform of FIG. 6A is rising, the forward drop voltage V4 of the diode 4 appears in the waveform of FIG. 6B.

When the rate of change of the depolarization voltage or the polarization voltage per unit time is large, the current flowing through the diode is large. The forward drop voltage of the diode in this case is also large, and the voltage supplied to the output of the individual electrode 213 and the gate 207 of the control unit is large.

Generally, the forward drop voltage of the diode varies depending on the kind or the current of the diode, but the forward drop voltage of the diode is less than 1 volt. In this embodiment, the gate 207 of the control unit is in the off state, and even if the forward drop voltage is supplied to the output of the gate, a significant problem will not arise.

However, in the case in which the protection circuit of the control unit is not enough or the forward drop voltage of the diode is larger than the reversed polarity withstanding voltage of the control unit, the small voltage fluctuations on the order of less than 1 volt at the time of polarization becomes a problem. To avoid the problem, an ink jet device of another embodiment of the invention is used. In this embodiment, a negative voltage is supplied to the cathode of the diode 4 and a positive voltage is supplied to the anode of the diode 5. Namely, a bias voltage which is less than the forward drop voltage of each of the diodes 4 and 5 is supplied, thus avoiding the problem.

Figure 7:
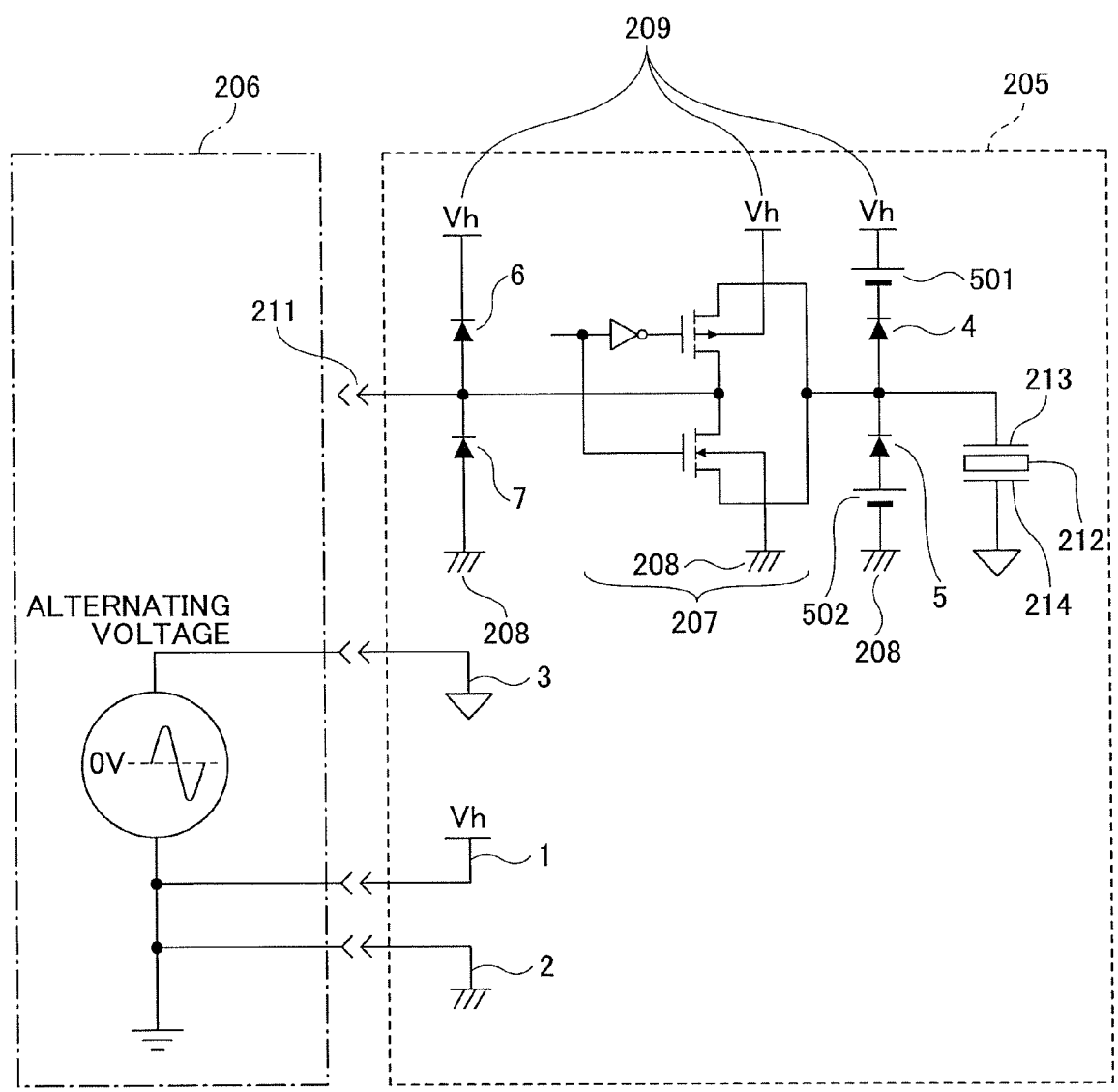
FIG. 7 is a circuit diagram showing the composition of an ink jet device of another embodiment of the invention.

The above embodiment of the invention will be described with reference to FIG. 7. If it is assumed that the forward drop voltage of the diodes 4 and 5 is equal to 0.5V, the bias voltage 501 of 0.5V is supplied to the cathode of the diode 4 and the bias voltage 502 of 0.5V is supplied to the anode of the diode 5. The voltage of the anode to the cathode of the diodes 4 and 5 is raised to a potential difference that can forward a sufficient current by the bias voltages 501 and 502. In the embodiment of FIG. 7, the voltage supplied to the output of the gate 207 of the control unit and the individual electrode 213 of the piezoelectric element 212 is nearly equal to 0V, and the reversed polarity voltage is not supplied.

Figure 8:
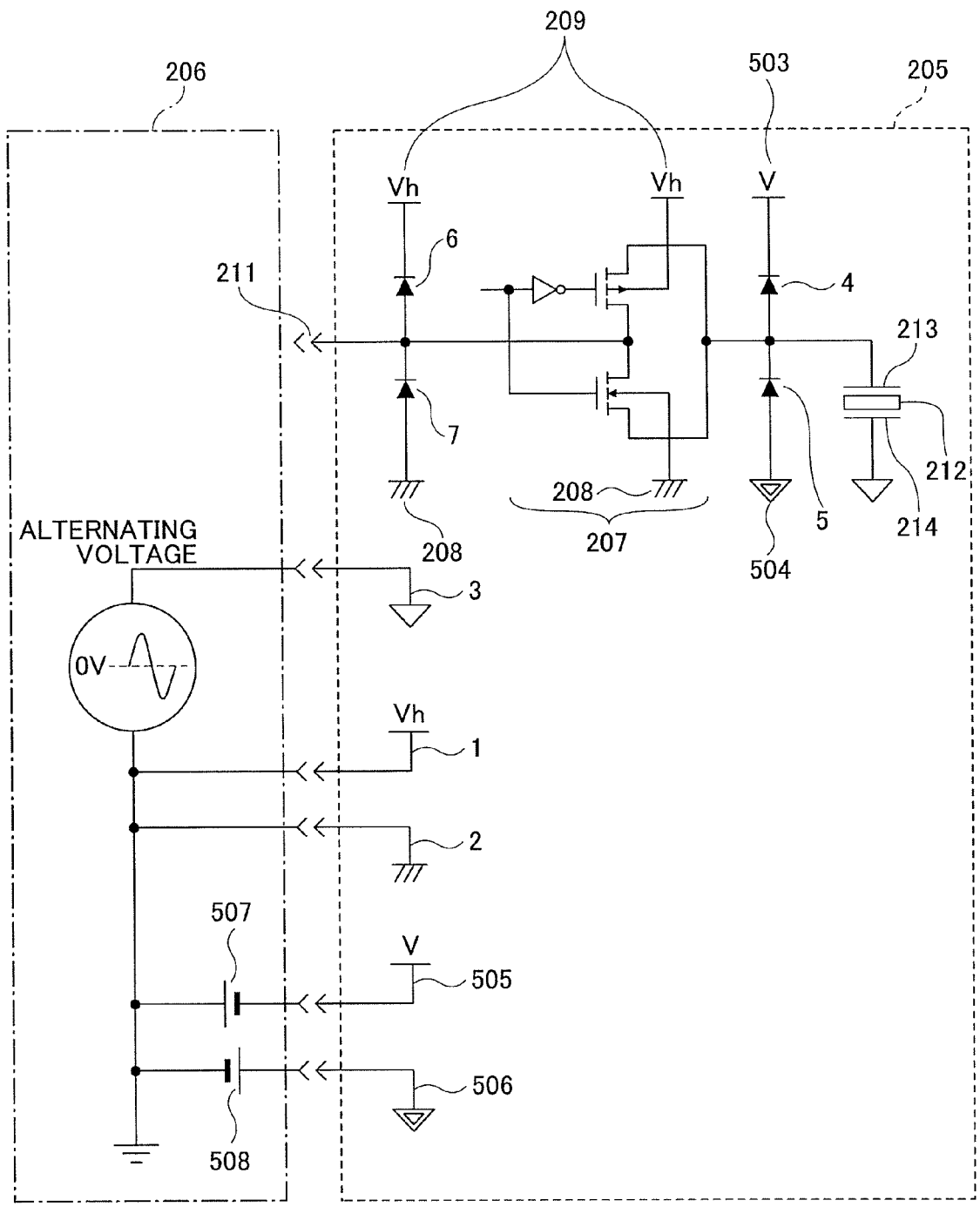
FIG. 8 is a circuit diagram showing the composition of an ink jet device of another embodiment of the invention.

Another embodiment of the invention will be described with reference to FIG. 8. The embodiment of FIG. 8 uses a control unit in which the cathode of the diode 4 is connected to a terminal 503 which is different from the high voltage power supply terminal 209 of the control unit and the anode of the diode 5 is connected to a terminal 504 which is different from the ground terminal 208 of the control unit. Using the head connecting substrate 206, the bias voltage 507 of 0.5V is supplied to the wiring 505 connected to the terminal 503, and the bias voltage 508 of 0.5V is supplied to the wiring 506 connected to the terminal 504. When compared with the composition of FIG. 7, in the embodiment of FIG. 8, the necessity of connection of an external diode and a power supply for every nozzle is eliminated, and the ink jet device can be produced with a low cost.

Figure 9:
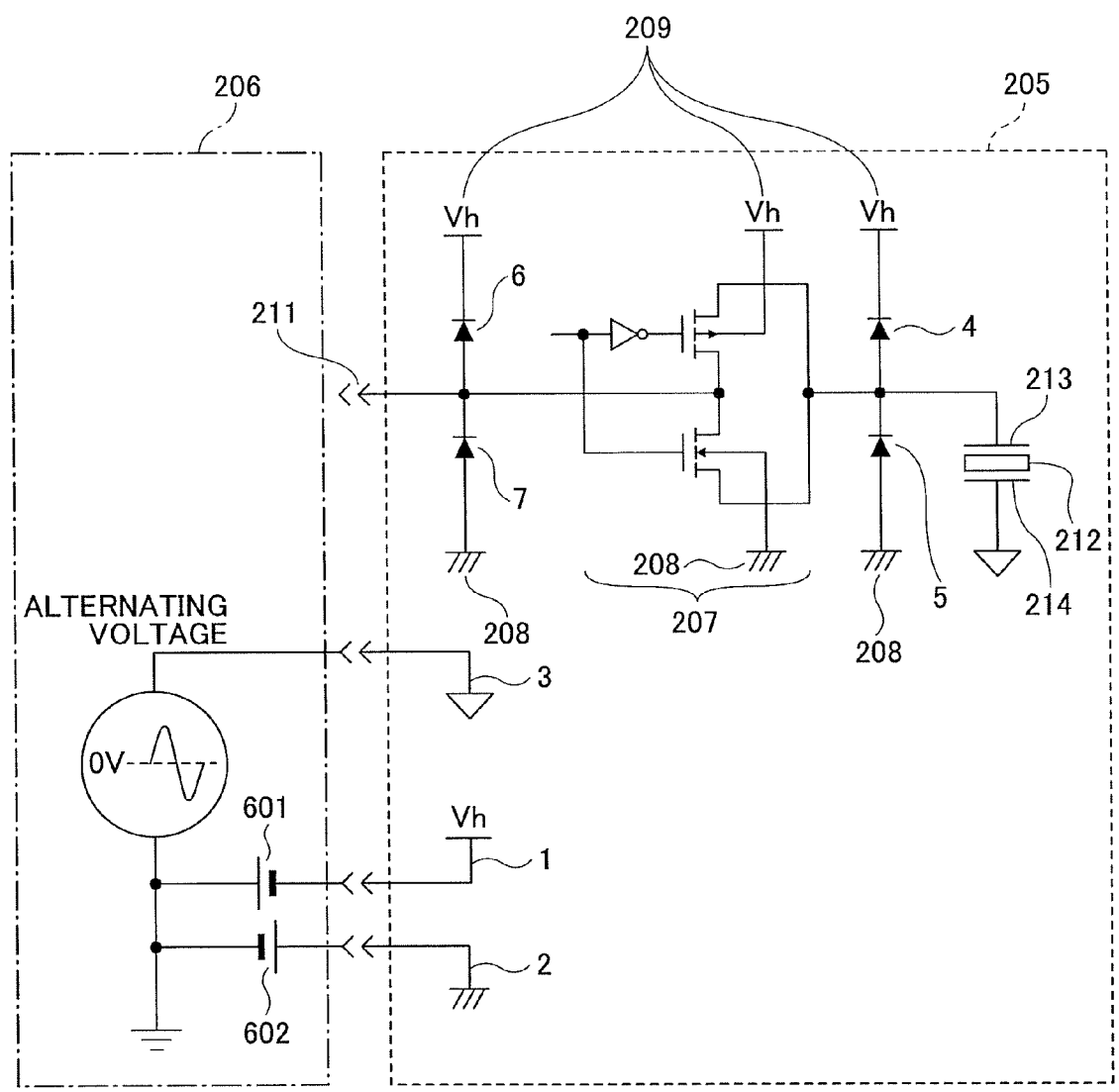
FIG. 9 is a circuit diagram showing the composition of an ink jet device of another embodiment of the invention.
Figure 10:
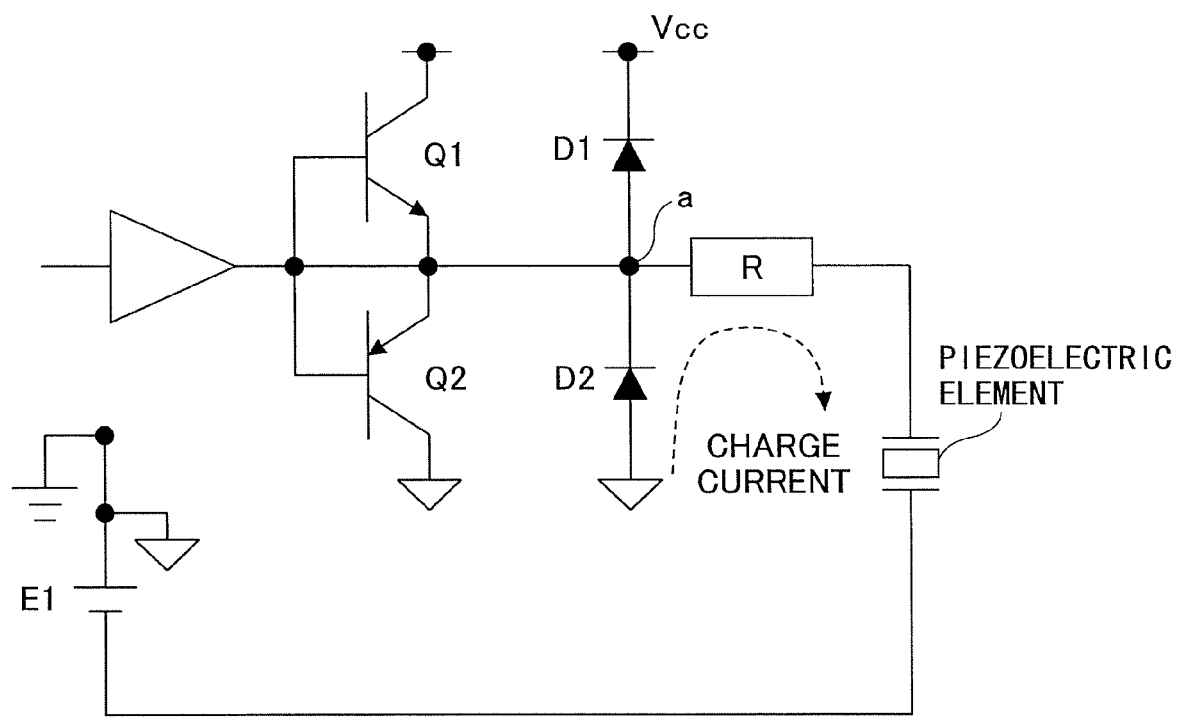
FIG. 10 is a circuit diagram showing a control circuit according to the related art.
Figure 12A:
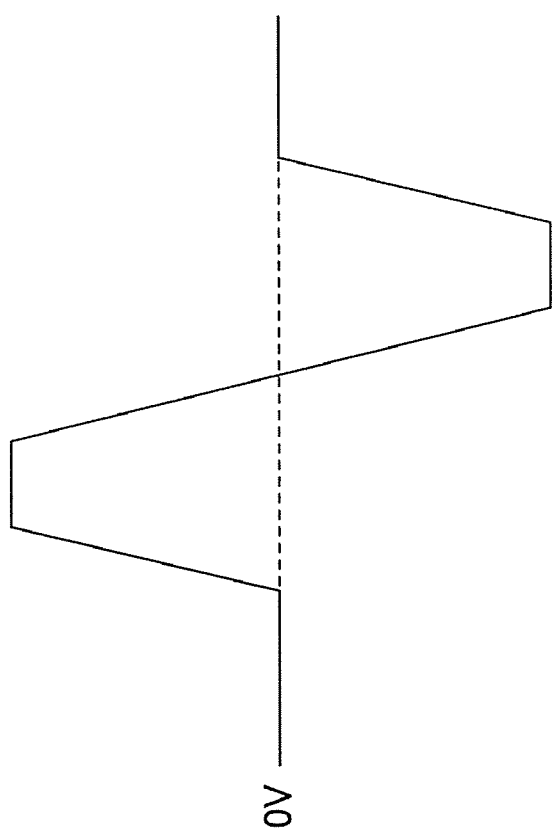
FIG. 12A and FIG. 12B are diagrams for explaining the problem of the control circuit according to the related art.
Figure 12B:
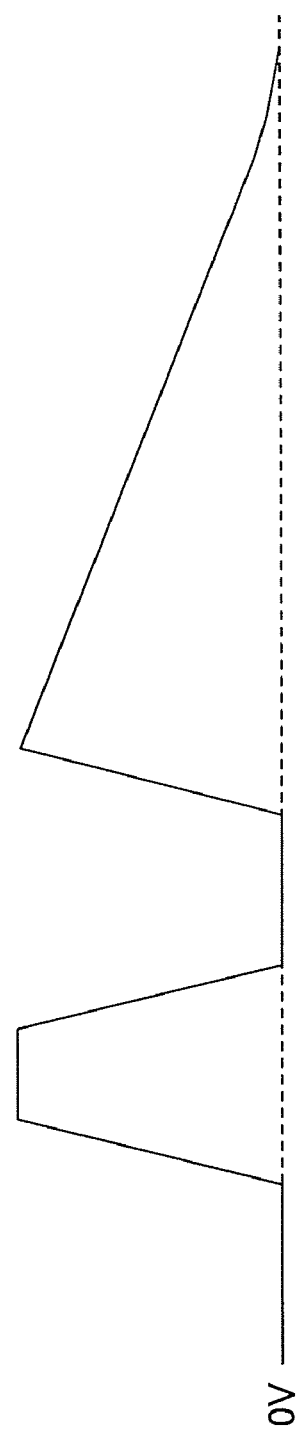

Another embodiment of the invention will be described with reference to FIG. 9. In the embodiment of FIG. 9, if it is assumed that the reversed polarity withstanding voltage of the control unit is equal to 0.4V and the forward drop voltage of the diodes 4 and 5 is equal to 0.5V, a voltage in a range of −0.5V to +0.5V may be supplied to the output of the gate 207 of the control unit and the individual electrode 213 of the piezoelectric element 212. There is a possibility that the control unit be destroyed. To avoid this, the bias voltage 601 of −0.25V is supplied to the high-voltage-power terminal 209, and the bias voltage 602 of +0.25V is supplied to the ground terminal 208 of the control unit.

In this case, the reversed polarity voltage of 0.25V which is the bias voltage is supplied to the ground terminal 208 and the high voltage power supply terminal 209 of the control unit, and the reversed polarity voltage of 0.25V which is the difference between the forward drop voltage 0.5V of the diodes 4 and 5 and the bias voltage 0.25V is supplied to the output of the gate 207 of the control unit. The supplied voltage for either terminal is smaller than 0.4V of the reversed polarity withstanding voltage of the control unit, and the destruction of the control unit does not take place. The voltage supplied to the individual electrode 213 of the piezoelectric element can be set in a range of −0.25V to +0.25V. In this composition, the parasitic diodes of the control unit may be used as the diodes 4 and 5.

If the rate of change of the depolarization voltage or the polarization voltage per unit time is large, the value of the charging or discharging current of the piezoelectric element will be large. In the manufacturing device of the invention, the charging or discharging current flows through the diodes 4 and 5. When the diodes in the control unit are used and the withstanding current value of the diodes 4 and 5 is small, it is necessary to reduce the rate of change of the depolarization voltage or the polarization voltage per unit time to a small level that the current flowing through the diodes 4 and 5 does not exceed the withstanding current value of the diodes. Otherwise, the diodes will be destroyed and consequently the control unit itself will be destroyed.

For example, if it is assumed that dV/dt denotes the rate of change of the depolarization voltage or the polarization voltage per unit time, I denotes the withstanding current value of the diodes 4 and 5 and C denotes the electrostatic capacity of the piezoelectric element, then the current flowing through the diodes 4 and 5 in the case of charging and discharging of the piezoelectric element is represented by CdV/dt. It is necessary to make the rate of change dV/dt of the depolarization voltage or the polarization voltage per unit time smaller than the value of I/C.

It is conceivable that the diode 4 and the diode 5 are produced in the control unit. In this case, it is not necessity to make additional diodes, and using the parasitic diodes of the control unit is convenient. If the withstanding current value of the diodes in the control unit is too small, external diodes may be attached. In that case, it is desirable to use a Schottky diode or a germanium diode having a small forward drop voltage.

The method of supplying the bias voltages 501, 502, 507, 508, 601 and 602 is not limited to the above embodiments using the power supply which generates a desired voltage. Alternatively, another voltage supplying method may be used. One alternative method is to supply a current to another diode and make use of the forward voltage drop of that diode.

To adjust the driving force of the piezoelectric element for each of the respective nozzles, the following process may be used. After the depolarization processing of the piezoelectric element is performed, the repolarization processing may be performed so that the optimal polarization voltage for each piezoelectric element is supplied, choosing the piezoelectric element which connects with second head connecting substrate 103, or carries out changing a switch as shown in FIG. 13, and performs repolarization by the control unit after designing so that the polarization voltage may become below the withstanding voltage of the control unit.

To make the polarization voltage below the withstanding voltage of the control unit, one of the following processes may be used: bringing the electrode interval of the piezoelectric element close; overheating the piezoelectric element at the time of polarization; and designing the ink jet head to set the drive voltage to a low level below the withstanding voltage of the control unit, so as to make the polarization voltage low.

The invention is applicable to not only the case of the depolarization or polarization of the piezoelectric element but also the case of supplying high voltage or supplying the voltage of the reversed polarity rather than it is in the state which mounted the control unit and usually driving to the ink-pressure control part.

According to the invention, it is possible to offer the ink jet head to which discharge characteristics are equal, without enlarging equipment cheaply, and the variation in a discharge liquid drop is small can apply also to the use of a high speed printer, manufacturing device of a flat panel display, a thin film coating apparatus, etc. which are demanded.

The ink jet device to which the manufacturing device of an embodiment of the invention is applied is any of various forms of ink jet device on which at least an ink jet head is mounted.

According to the manufacturing device of the embodiment of the invention, it is possible to perform depolarization or polarization of the piezoelectric element in the ink jet head on which the control unit is mounted, and the problem of the destruction of the control unit can be avoided.

According to the manufacturing device of the embodiment of the invention, the ink jet device may be caused to perform depolarization of the piezoelectric element and subsequently perform repolarization of the piezoelectric element using an optimal polarization voltage individually for each of the nozzles of the ink jet head, and it is possible to suppress the variations in the discharge liquid drop for the respective nozzles of the ink jet head.

The present invention is not limited to the specifically disclosed embodiments, and variations and modifications may be made without departing from the scope of the present invention.

The present application is based on Japanese patent application No. 2008-085390, filed on Mar. 28, 2008, and Japanese patent application No. 2009-063584, filed on Mar. 16, 2009, the contents of which are incorporated herein by reference in their entirety.

What is claimed is:

1. An ink jet head manufacturing device for manufacturing an ink jet head having a substrate on which an ink pressure chamber, an ink-pressure control part to increase or decrease a pressure of ink within the ink pressure chamber, and a control unit to control a driving signal supplied to the ink-pressure control part are mounted, wherein the ink jet head manufacturing device is arranged so that a first wiring connected to a high voltage power supply terminal of the control unit, a second wiring connected to a ground terminal of the control unit, and a third wiring connected to a common electrode of the ink-pressure control part are not mutually short-circuited on the substrate of the ink jet head, the ink jet head manufacturing device comprising:

first and second diodes arranged on a path extending from a gate of the control unit to an individual electrode of the ink-pressure control part, the first diode allowing a current from the individual electrode of the ink-pressure control part to flow into the first wiring, and the second diode allowing a current from the second wiring to flow into the individual electrode of the ink-pressure control part; and a short-circuit unit arranged to short-circuit the first wiring and the second wiring when depolarization or polarization of the ink-pressure control part is performed.

2. The ink jet head manufacturing device according to claim 1, wherein, when performing depolarization or polarization of the ink-pressure control part, a depolarization voltage or a polarization voltage is supplied to between the third wiring which is separated from the first wiring and the second wiring, and the first wiring and the second wiring which are short-circuited and set to a same potential.

3. The ink jet head manufacturing device according to claim 1, further comprising a short-circuit cancel unit arranged to cancel the short circuit of the first wiring and the second wiring after the depolarization or the polarization is completed.

4. The ink jet head manufacturing device according to claim 3, wherein the short-circuit unit is arranged to short-circuit the first wiring and the second wiring when performing depolarization or polarization of the ink-pressure control part, the short-circuit cancel unit is arranged to cancel the short circuit of the first wiring and the second wiring after the depolarization or the polarization is completed, and each of the short-circuit unit and the short-circuit cancel unit is constituted by a switch.

5. The ink jet head manufacturing device according to claim 1, wherein the first diode and the second diode are parasitic diodes of the control unit.

6. The ink jet head manufacturing device according to claim 1, wherein the ink jet head comprises an ink-jet-head side first terminal connected to the first wiring and an ink-jet-head side second terminal connected to the second wiring, wherein the ink jet head manufacturing device comprises a first head connecting substrate and a second head connecting substrate, the first head connecting substrate including first and second terminals which can be fitted to the ink-jet-head side first and second terminals respectively, and the first head connecting substrate being arranged so that the first terminal of the first head connecting substrate corresponding to the ink-jet-head side first terminal and the second terminal of the first head connecting substrate corresponding to the ink-jet-head second terminal are short-circuited thereon, the second head connecting substrate including third and fourth terminals which can be fitted to the ink-jet-head side first and second terminals respectively, and the second head connecting substrate being arranged so that the third terminal of the second head connecting substrate corresponding to the ink-jet-head side first terminal and the fourth terminal of the second head connecting substrate corresponding to the ink-jet-head side second terminal are not short-circuited thereon.

7. The ink jet head manufacturing device according to claim 1, wherein the ink jet head manufacturing device is able to perform depolarization of the ink-pressure control part in the ink jet head after shipment and subsequently perform polarization of the ink-pressure control part using an optimal polarization voltage individually for each of nozzles of the ink jet head.

8. The ink jet head manufacturing device according to claim 1, wherein a bias voltage that is smaller than or equal to a forward drop voltage is supplied to the first and second diodes, so that a positive voltage is applied to a cathode of the first diode and a negative voltage is applied to an anode of the second diode.

9. The ink jet head manufacturing device according to claim 1, wherein a rate of change of a depolarization voltage or a polarization voltage per unit time is controlled so that a current flowing through the first and second diodes does not exceed a withstanding current value of each of the first and second diodes.

10. An ink jet device including an ink jet head and a head connecting substrate, the ink jet head including a substrate on which an ink pressure chamber, an ink-pressure control part to increase or decrease a pressure of ink within the ink pressure chamber, and a control unit to control a driving signal supplied to the ink-pressure control part are mounted, and the head connecting substrate being arranged to perform one of driving, polarization and depolarization of the ink-pressure control part in the ink jet head, the ink jet head is arranged so that a first wiring connected to a high voltage power supply terminal of the control unit, a second wiring connected to a ground terminal of the control unit, and a third wiring connected to a common electrode of the ink-pressure control part are not mutually short-circuited on the substrate of the ink jet head, the ink jet head comprising first and second diodes arranged on a path extending from a gate of the control unit to an individual electrode of the ink-pressure control part, the first diode allowing a current from the individual electrode of the ink-pressure control part to flow into the first wiring, and the second diode allowing a current from the second wiring to flow into the individual electrode of the ink-pressure control part, and the head connecting substrate comprising a short-circuit unit arranged to short-circuit the first wiring and the second wiring when depolarization or polarization of the ink-pressure control part is performed.

11. An ink jet head manufacturing method for manufacturing an ink jet head having a substrate on which an ink pressure chamber, an ink-pressure control part to increase or decrease a pressure of ink within the ink pressure chamber, and a control unit to control a driving signal supplied to the ink-pressure control part are mounted, wherein the ink jet head is arranged so that a first wiring connected to a high voltage power supply terminal of the control unit, a second wiring connected to a ground terminal of the control unit, and a third wiring connected to a common electrode of the ink-pressure control part are not mutually short-circuited on the substrate of the ink jet head, the ink jet head comprising first and second diodes arranged on a path extending from a gate of the control unit to an individual electrode of the ink-pressure control part, the first diode allowing a current from the individual electrode of the ink-pressure control part to flow into the first wiring, and the second diode allowing a current from the second wiring to flow into the individual electrode of the ink-pressure control part, the ink jet head manufacturing method comprising a step of short-circuiting the first wiring and the second wiring when depolarization or polarization of the ink-pressure control part is performed.

12. The ink jet head manufacturing method according to claim 11, wherein, when depolarization or polarization of the ink-pressure control part is performed after the short-circuiting step, a depolarization voltage or a polarization voltage is supplied to between the third wiring which is separated from the first wiring and the second wiring, and the first wiring and the second wiring which are short-circuited and set to a same potential.

13. The ink jet head manufacturing method according to claim 11, wherein the first diode and the second diode are parasitic diodes of the control unit.

14. The ink jet head manufacturing method according to claim 11, wherein a bias voltage that is smaller than or equal to a forward drop voltage is supplied to the first and second diodes, so that a positive voltage is applied to a cathode of the first diode and a negative voltage is applied to an anode of the second diode.

15. The ink jet head manufacturing method according to claim 11, wherein a rate of change of a depolarization voltage or a polarization voltage per unit time is controlled so that a current flowing through the first and second diodes does not exceed a withstanding current value of each of the first and second diodes.

* * * * *